(12) United States Patent
Schwan

(10) Patent No.: US 12,266,875 B2
(45) Date of Patent: Apr. 1, 2025

(54) ASSEMBLY FOR SECURING A PRINTED CIRCUIT BOARD TO A PLUG BODY, METHOD OF SECURING A PRINTED CIRCUIT BOARD TO A PLUG BODY

(71) Applicant: TE Connectivity Germany GmbH, Bensheim (DE)

(72) Inventor: Ralf Schwan, Bensheim (DE)

(73) Assignee: TE Connectivity Germany GmbH, Bensheim (DE)

( * ) Notice: Subject to any disclaimer, the term of this patent is extended or adjusted under 35 U.S.C. 154(b) by 340 days.

(21) Appl. No.: 17/734,991

(22) Filed: May 2, 2022

(65) Prior Publication Data

US 2022/0352659 A1 Nov. 3, 2022

(30) Foreign Application Priority Data

Apr. 30, 2021 (DE) .......................... 102021111250.8

(51) Int. Cl.
*H01R 12/70* (2011.01)
*H01R 13/502* (2006.01)
(Continued)

(52) U.S. Cl.
CPC ..... *H01R 12/7058* (2013.01); *H01R 12/7052* (2013.01); *H01R 13/502* (2013.01);
(Continued)

(58) Field of Classification Search
CPC ............ H01R 12/7058; H01R 12/7052; H01R 13/502; H01R 43/205; H01R 12/714;
(Continued)

(56) References Cited

U.S. PATENT DOCUMENTS 6,695,629 B1 * 2/2004 Mayer .................... H05K 7/142
361/752
6,781,055 B2 * 8/2004 Chen ...................... H05K 7/142
361/752
(Continued)

FOREIGN PATENT DOCUMENTS

DE 102016211876 A1 1/2018
DE 102016114352 A1 2/2018
(Continued)

OTHER PUBLICATIONS

French Search Report, No. FR2203967, dated Jul. 31, 2024, 9 pages.
(Continued)

*Primary Examiner* — Alexander Gilman
(74) *Attorney, Agent, or Firm* — Barley Snyder

(57) ABSTRACT

Shown is an assembly or securing a printed circuit board to a plug body, having a contact element with a holding face facing against a plugging direction of the contact element, and a securing member, that can be transferred into a securing position, in which the printed circuit board is secured by the securing member in a positive fit manner against the plug direction at the holding face. Further shown is a method of securing a printed circuit board at the plug body, wherein a holding face of a contact element facing against a plug direction is inserted through an opening in the printed circuit board and subsequently a securing member is transferred to a securing position, in which the printed circuit board is secured by the securing member in a positive fit manner against the plug direction at the holding face.

15 Claims, 17 Drawing Sheets

(51) Int. Cl.
  *H01R 43/20* (2006.01)
  *H01R 12/71* (2011.01)
  *H01R 13/52* (2006.01)
(52) U.S. Cl.
  CPC ......... *H01R 43/205* (2013.01); *H01R 12/714* (2013.01); *H01R 13/521* (2013.01)
(58) Field of Classification Search
  CPC .. H01R 13/521; H01R 13/04; H01R 13/4362; H01R 12/58; H01R 13/6658; H01R 4/54; H01R 13/665; H01R 13/40; H01R 13/426; H01R 13/52; H01R 13/66; H01R 43/20; H05K 1/184; H05K 2201/10189; B60L 53/16
  USPC .......................................................... 439/78
  See application file for complete search history.

(56) References Cited

U.S. PATENT DOCUMENTS

| | | | | |
|---|---|---|---|---|
| 6,964,581 | B2 * | 11/2005 | Chen | H05K 7/1417 361/759 |
| 7,028,389 | B2 * | 4/2006 | Chang | H05K 7/142 174/544 |
| 7,245,496 | B1 * | 7/2007 | Luo | H05K 7/142 361/742 |
| 7,364,442 | B2 * | 4/2008 | Bang | H05K 1/119 439/97 |
| 7,384,283 | B2 * | 6/2008 | Lin | H05K 7/142 439/157 |
| 7,385,830 | B2 * | 6/2008 | Liu | H05K 7/142 174/138 R |
| 7,430,129 | B1 * | 9/2008 | Peng | H05K 7/1417 361/742 |
| 7,462,055 | B2 * | 12/2008 | Kuo | H05K 7/1417 361/759 |
| 7,876,569 | B2 * | 1/2011 | Xue | G06F 1/184 361/801 |
| 7,983,057 | B2 * | 7/2011 | Zheng | H05K 7/142 361/752 |
| 8,351,211 | B2 * | 1/2013 | Maeda | H05K 7/20509 361/752 |
| 8,474,927 | B2 * | 7/2013 | Lin | H05K 7/142 312/352 |
| 8,500,485 | B2 * | 8/2013 | Fu | H01R 13/748 439/545 |
| 9,077,795 | B2 * | 7/2015 | Kiple | H04M 1/0277 |
| 9,391,397 | B2 | 7/2016 | Jetter et al. | |
| 9,837,751 | B2 * | 12/2017 | Lai | H01R 13/516 |
| 9,859,642 | B2 * | 1/2018 | Hashiguchi | H01R 13/627 |
| 10,064,295 | B2 * | 8/2018 | Kim | G06F 1/1601 |
| 10,418,756 | B2 | 9/2019 | Fennen et al. | |
| 10,454,194 | B1 * | 10/2019 | Phillips | H05K 1/117 |
| 10,547,131 | B2 * | 1/2020 | Feldner | H01R 27/02 |
| 10,736,228 | B2 * | 8/2020 | Kho | G11B 33/142 |
| 11,006,540 | B2 * | 5/2021 | Weber | H05K 1/0215 |
| 11,069,992 | B2 * | 7/2021 | Feldner | B60L 53/62 |
| 11,153,984 | B1 * | 10/2021 | Chen | H05K 5/0226 |
| 2005/0101165 | A1 * | 5/2005 | Pan | H01R 12/714 439/79 |
| 2010/0254407 | A1 | 10/2010 | Tanaka et al. | |
| 2015/0255919 | A1 * | 9/2015 | Yano | H01R 12/91 439/39 |
| 2016/0143144 | A1 * | 5/2016 | Preuschl | F21V 17/101 29/832 |
| 2019/0260169 | A1 * | 8/2019 | Schmitz | H01R 13/113 |
| 2019/0363500 | A1 * | 11/2019 | Sahm | H01R 43/0263 |
| 2019/0393647 | A1 * | 12/2019 | Nguyen | H01R 12/79 |
| 2023/0324025 | A1 * | 10/2023 | Hackbarth | H01R 12/7023 362/508 |

FOREIGN PATENT DOCUMENTS

| | | |
|---|---|---|
| EP | 3886263 A1 | 3/2020 |
| JP | 2015170573 A | 9/2015 |
| KR | 1020140007844 A | 1/2014 |
| KR | 1020180122339 A | 11/2018 |

OTHER PUBLICATIONS

Indian Examination Report, App. No. 202244024217, dated Jan. 6, 2023, 5 pages.
Korean Office Action dated May 28, 2024 with English translation, corresponding to Application No. 10-2022-0052831, 11 pages.
German Office Action, Application No. 102021111250.8, Dated: Dec. 23, 2021, 5 pages.
Japanese Office Action from dated May 30, 2023, with English translation thereof, corresponding to Application No. 2022-072121, 9 pages.

* cited by examiner

ASSEMBLY FOR SECURING A PRINTED CIRCUIT BOARD TO A PLUG BODY, METHOD OF SECURING A PRINTED CIRCUIT BOARD TO A PLUG BODY

CROSS-REFERENCE TO RELATED APPLICATIONS

This application claims the benefit of the filing date under 35 U.S.C. § 119(a)-(d) of German Patent Application No. 102021111250.8, filed on Apr. 30, 2021.

FIELD OF THE INVENTION

The invention relates to an assembly for securing a printed circuit board to a plug body and a method of securing a printed circuit board to a plug body.

BACKGROUND

Many plugs, for example plugs for electric vehicles, include a printed circuit board where elements for measuring, controlling, or for the communication with a mating plug are provided. Typically, this printed circuit board is fixed to the plug body by one or more screws. However, this involves a complex assembly and requires space.

There exists a need for a solution that is space-saving and the assembly of which is less complex.

SUMMARY

According to the invention, an assembly for securing a printed circuit board to a plug body in a space-saving and less complex way has a contact element with a holding face facing against a plugging direction of the contact element, and a securing member that can be transferred to a securing position in which the printed circuit board is secured to the holding face along the plugging direction by the securing member in a positive fit manner.

A method of securing a printed circuit board to a plug body, features a holding face of a contact element oriented against the plugging direction being inserted through an opening in the printed circuit board. Subsequently, a securing member is transferred to a securing position in which the printed circuit board is held at the holding face along the plugging direction by the securing member in a positive fit manner.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
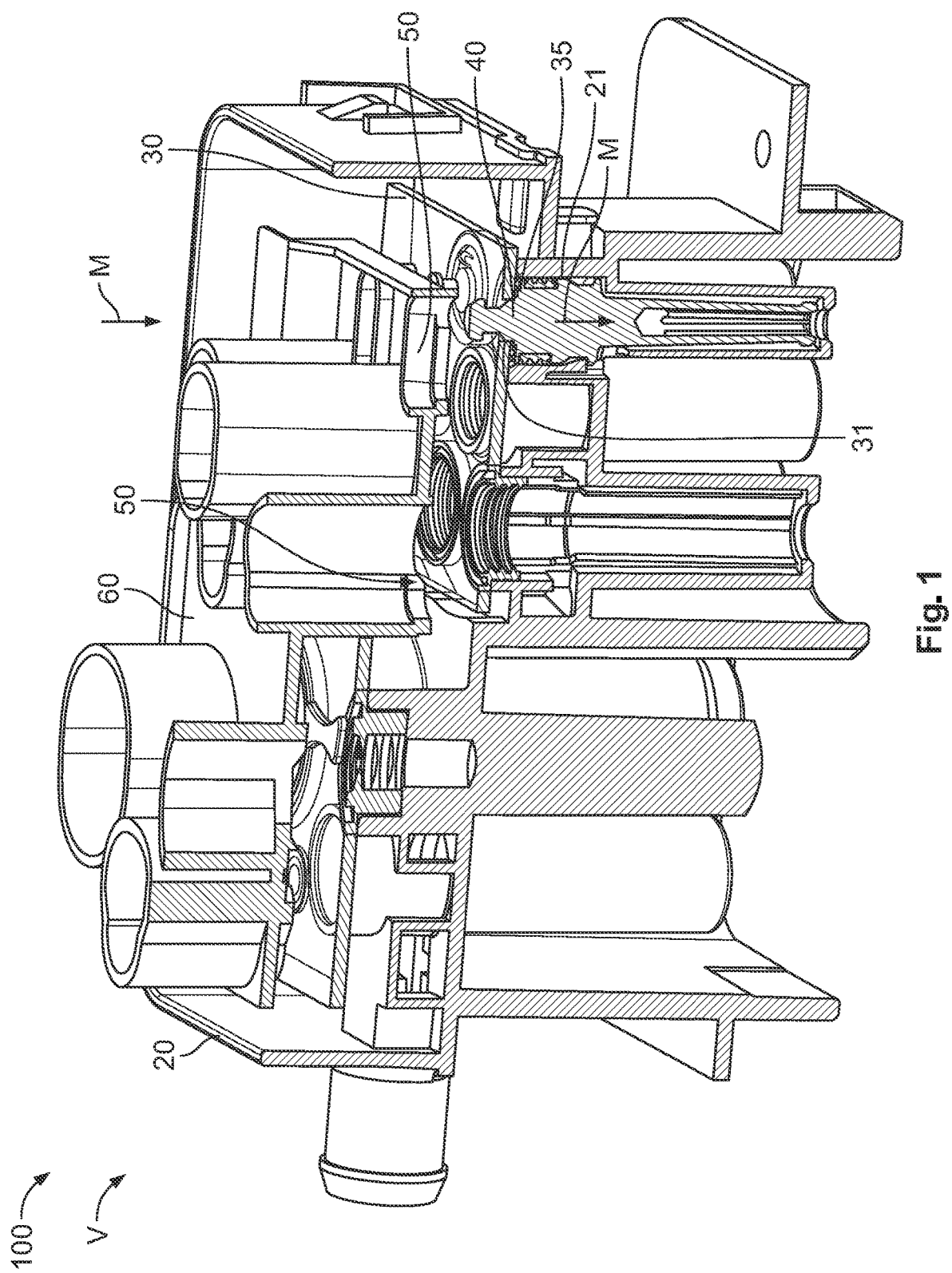
FIG. 1 is a partial sectional perspective view of an embodiment of an assembly in a pre-assembly position.

In the following, the invention is exemplarily described in more detail by embodiments with reference to the accompanying figures. In the figures, elements which correspond to one another in terms of structure and/or function are provided with the same reference signs.

The combinations of features shown and described in the individual embodiments are for explanatory purposes only. A feature of an embodiment may be omitted if its technical effect is not important for a particular application. Conversely, another feature may be added to an embodiment if its technical effect is advantageous for a particular application.

In FIGS. 1 to 9, a first embodiment of an assembly 100 for securing a printed circuit board 30 to a plug body 20 is shown. The assembly 100 can be part of a plug 110 which is used, for example, for charging electric vehicles. In such plugs 110, printed circuit boards 30 are often present which serve to monitor or control the charging process or measure relevant parameters. To this end, for example, a mating contact element 35 for a contact element 40 of the plug 110 can be present at the bottom of the printed circuit board 30 to measure a voltage.

In the shown examples, each of the printed circuit boards 30 is represented to be transparent to be able to view elements located behind them.

In the shown assemblies 100, a connection of the printed circuit board 30 with the plug body 20 by means of a screw can be omitted. The printed circuit board 30 is rather held by a securing member 50 in a positive fit manner when the securing member 50 is in a securing position L.

In FIG. 1, a pre-assembly position V is shown. After the contact element 40 has been inserted into a contact element retainer or opening 21 in the plug body 20 along an assembly direction M, a securing element 60 with a plurality of securing members 50 is now attached to the plug body 20 along the assembly direction M.

Figure 2:
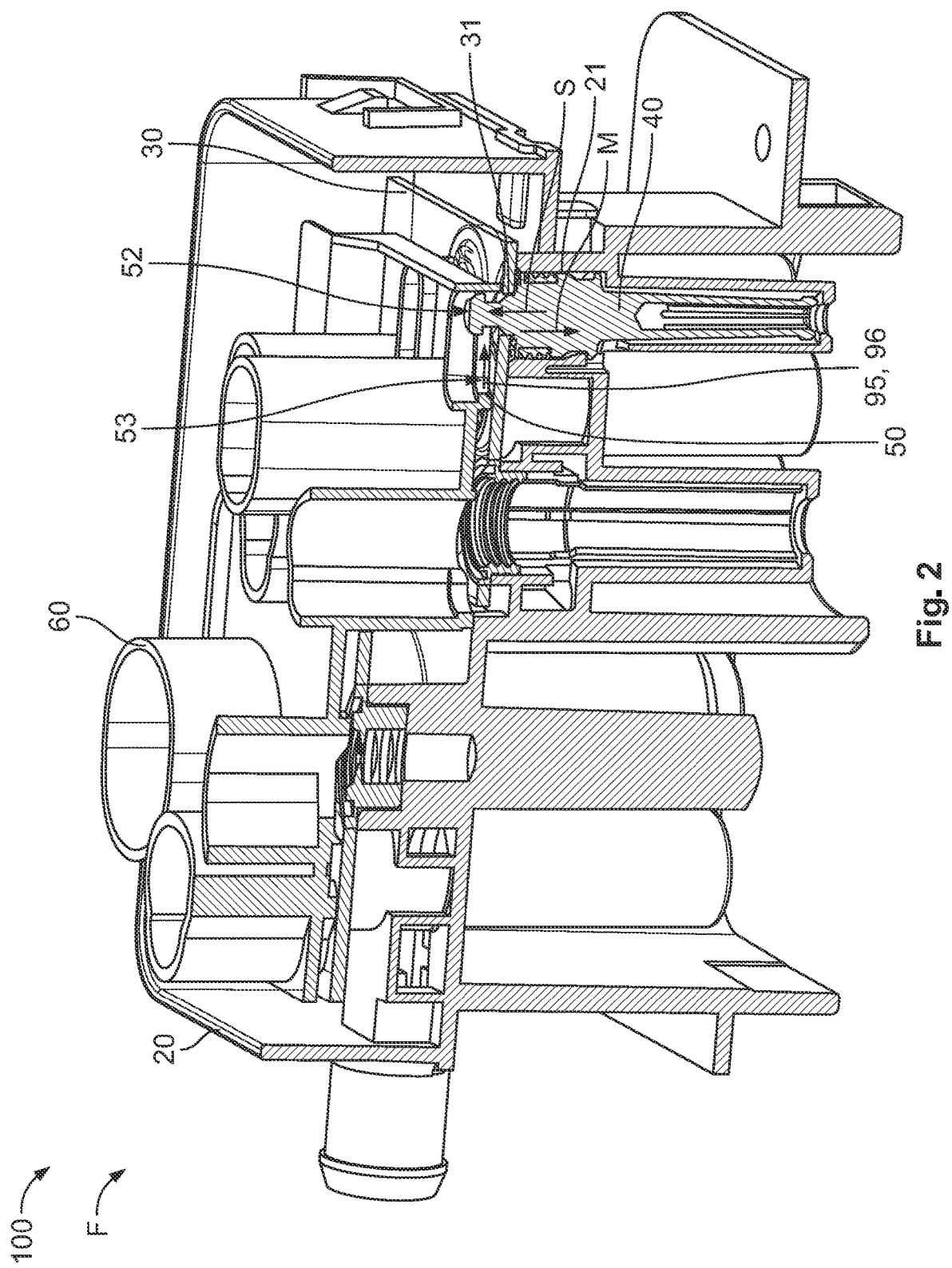
FIG. 2 is a partial sectional sectional perspective view of the embodiment of FIG. 1 in a release position.
Figure 3:
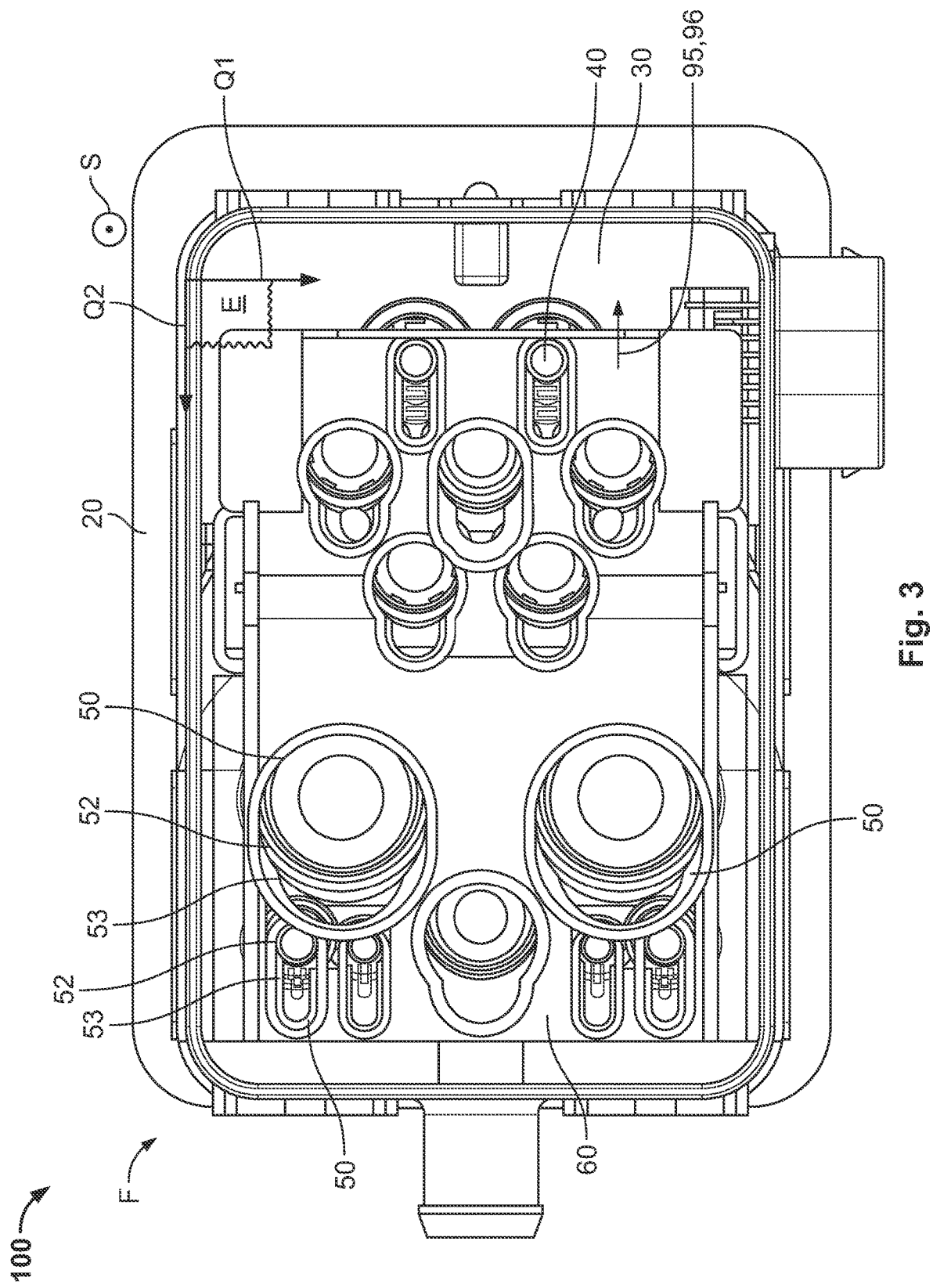
FIG. 3 is a top view of the embodiment of FIG. 1 in the release position.

In FIGS. 2 and 3, a release position F is represented. The securing element 60 abuts against the plug body 20, and the contact element 40 projects through the printed circuit board 30 and the securing member 50 along a plugging direction S. In particular, the contact element 40 projects through a plugging section 52 of the securing member 50. The contact element 40 is a low-voltage contact element. In the release position F, only low-voltage contact elements are inserted in the plug body 20.

The securing member 50 is now brought to a pre-securing position P by moving the securing element 60 along a path section 95. The path section 95 here extends perpendicular to the plugging direction S and in parallel to a plane E. The plane E is defined by a first transverse direction Q1 and a second transverse direction Q2, wherein the first transverse direction Q1 and the second transverse direction Q2 each extend perpendicular to the plugging direction S. The fact that a plurality of securing members 50 are present at the securing element 60 results in one single guiding path 96 being present along which the securing element 60 is guided.

Figure 4:
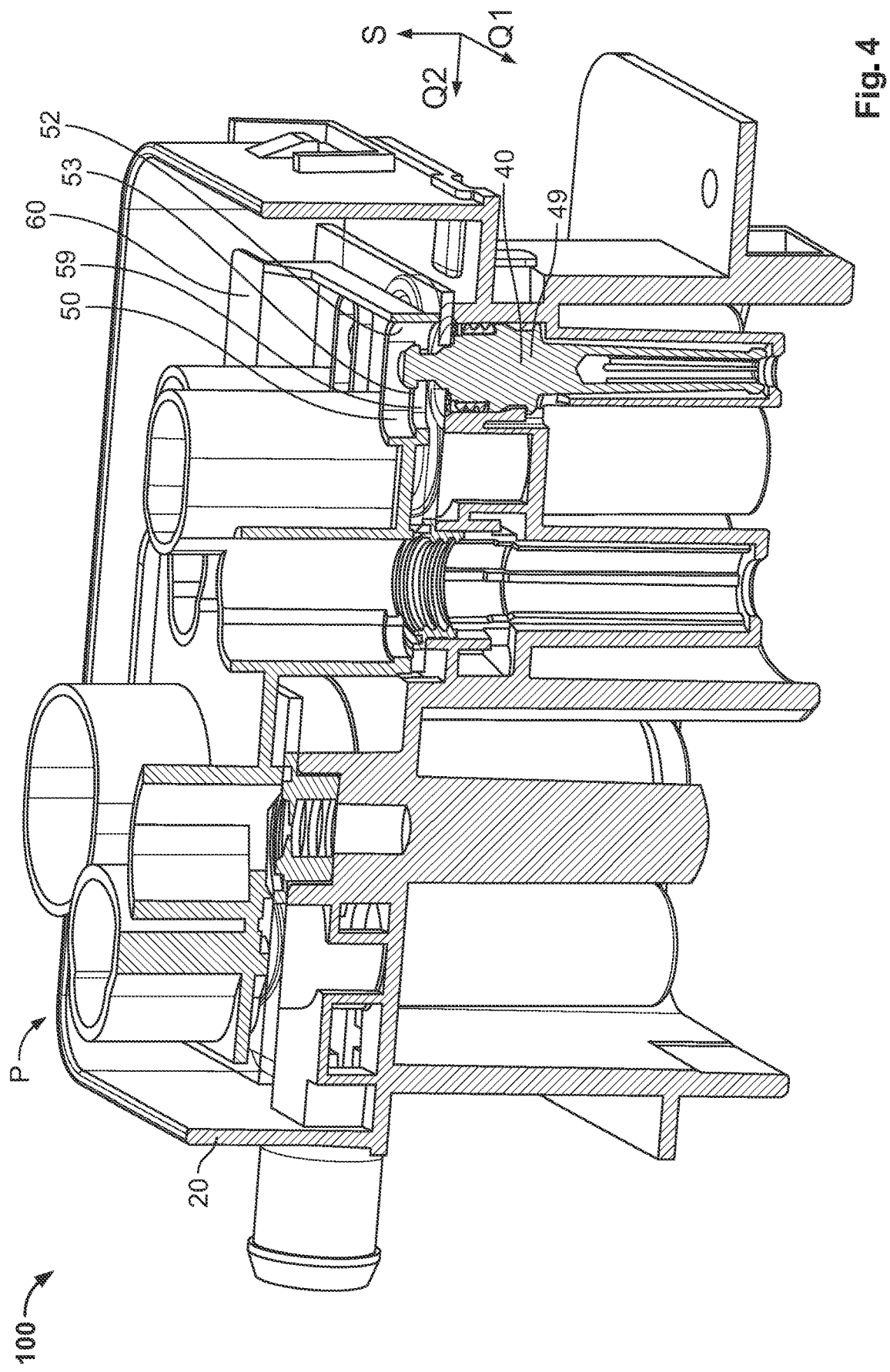
FIG. 4 is a partial sectional perspective view of the embodiment of FIG. 1 in a pre-securing position.
Figure 5:
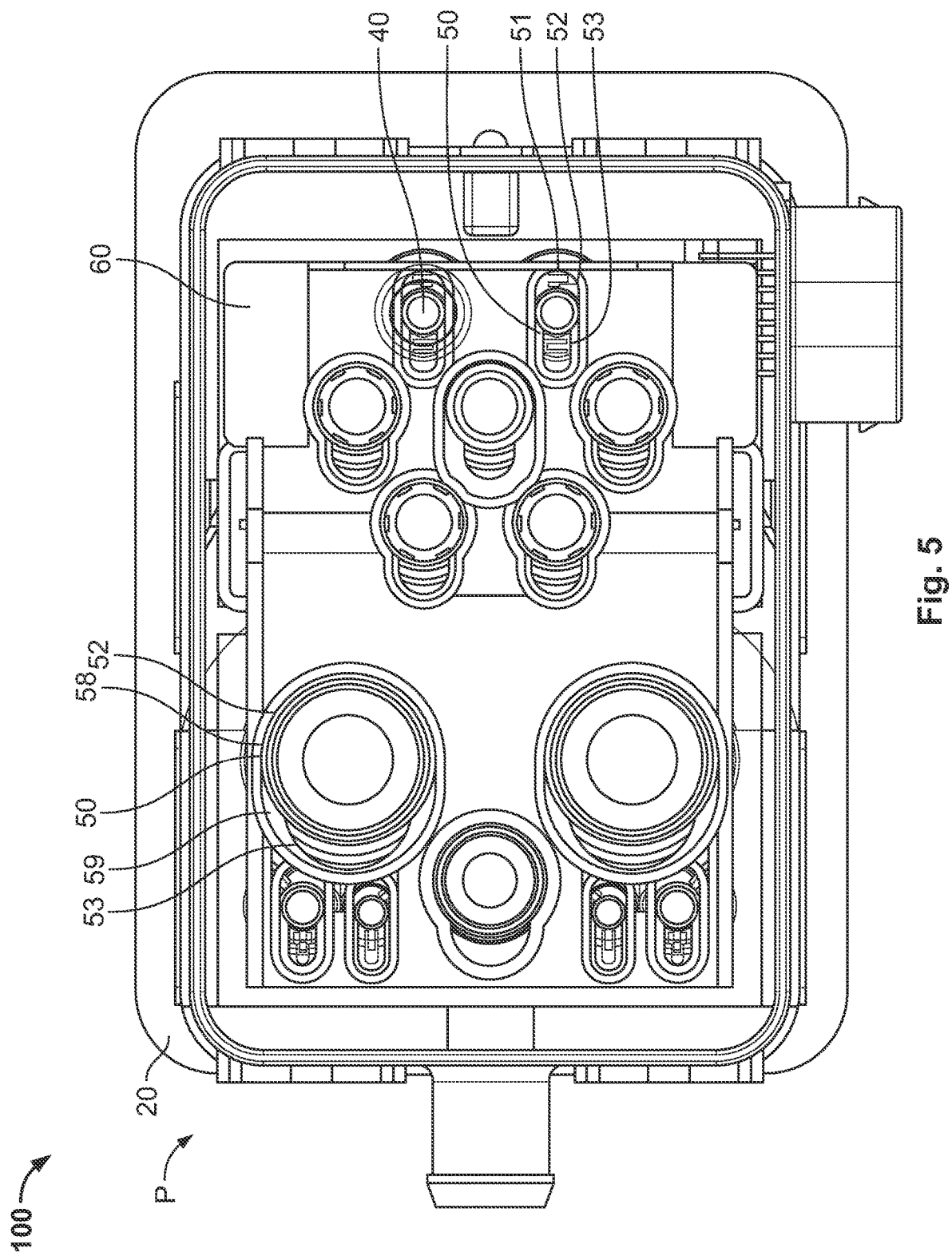
FIG. 5 is a top view of the embodiment of FIG. 1 in the pre-securing position.
Figure 6:
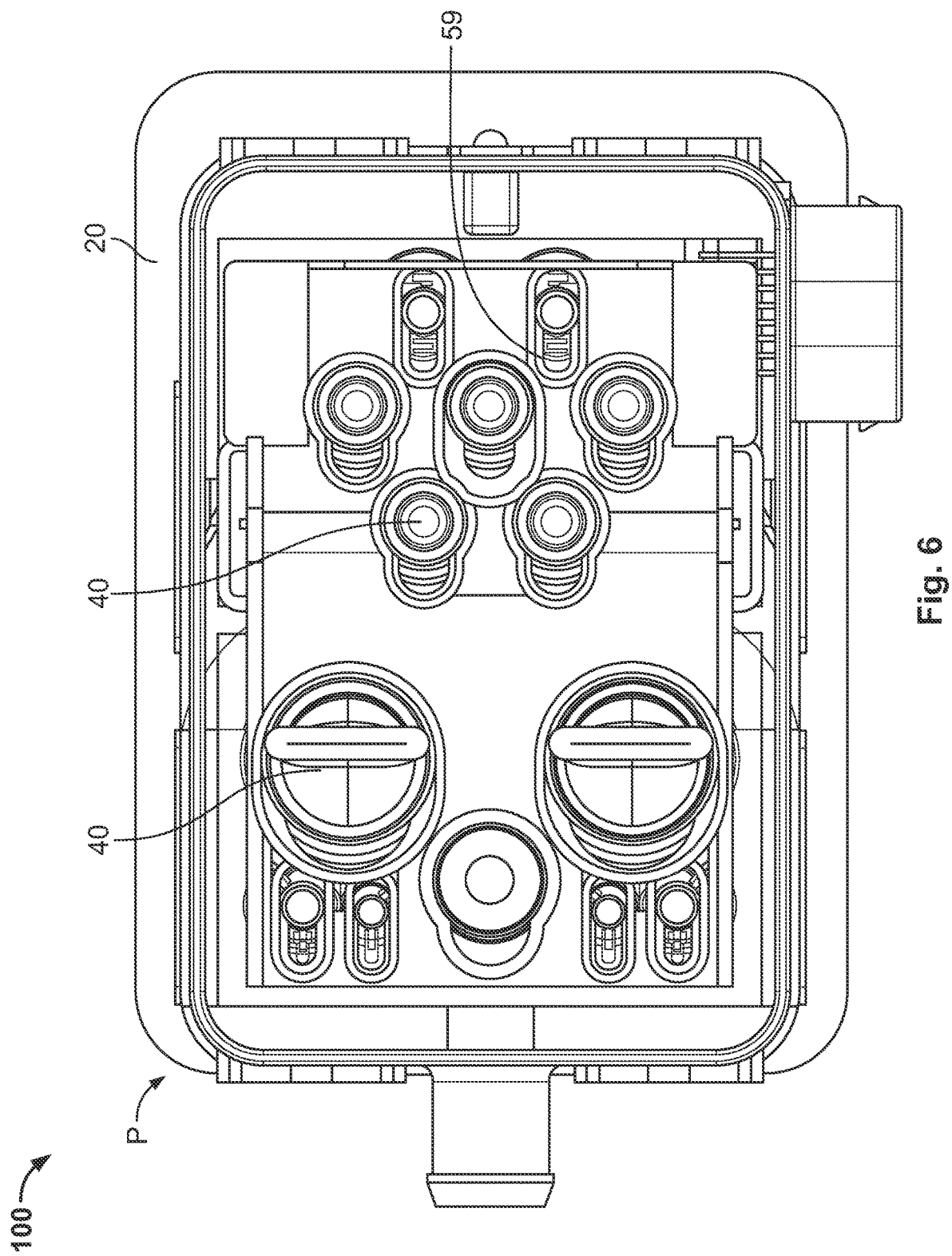
FIG. 6 is a top view of the embodiment of FIG. 1 in the pre-securing position of FIGS. 4 and 5 with further contact elements.
Figure 7:
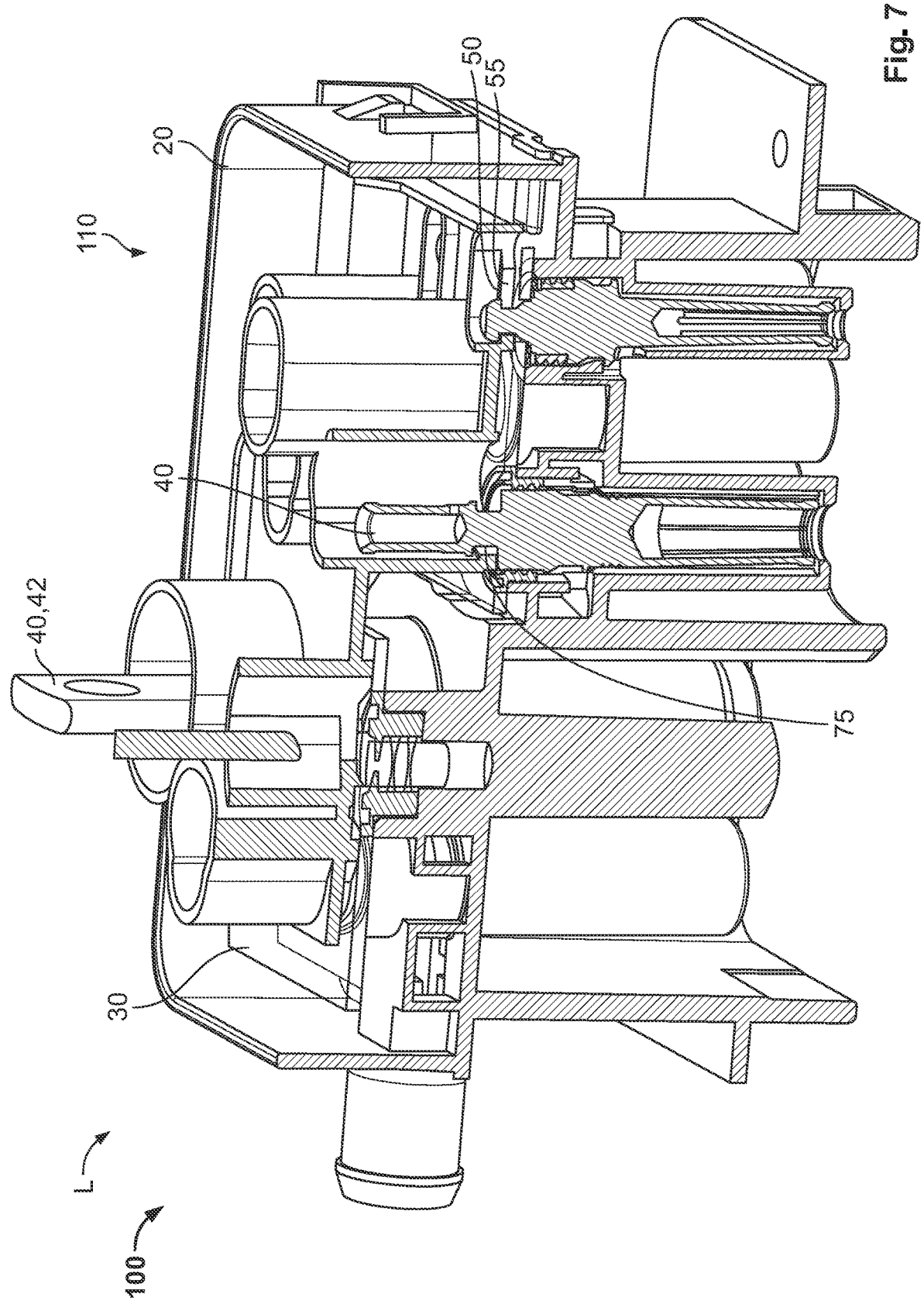
FIG. 7 is a partial sectional perspective view of the embodiment of FIG. 1 in a securing position.

The pre-securing position P is shown in FIGS. 4 and 5. One can in particular see that the inserted contact elements 40 already secure the printed circuit board 30 via the securing element 60 in a positive fit manner. In the pre-securing position P, further contact elements 40, 42, in particular high-voltage or high-current contact elements, can now be inserted, see FIG. 6.

By further moving the securing element 60 along the guiding path 96, the securing members 50 can be brought to a securing position L. In the securing position L, the printed circuit board 30 is secured to a holding face 45 of the first contact element 40, 41 by the securing member 50 along the plugging direction S in a positive fit manner. The securing element 60 furthermore serves, in the securing position L, as a contact retention 75 for the contact elements 40, 41, 42 which secures the positions of the contact elements 40, 41, and 42 along and/or against the plugging direction S.

Figure 8:
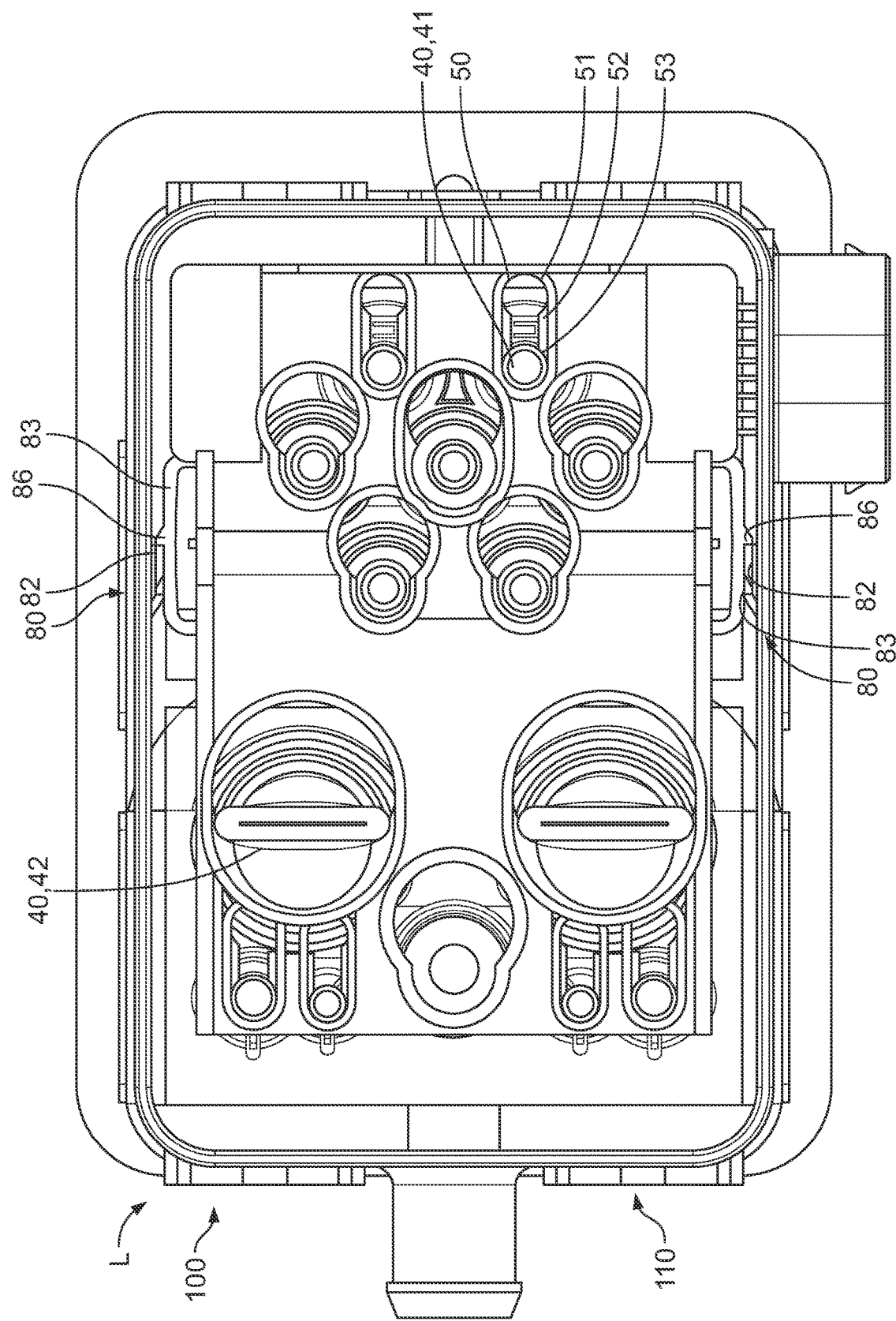
FIG. 8 is a top view of the embodiment of FIG. 1 in the securing position.

As can be seen, for example, in FIG. 8, the securing members 50 include contact openings 58 or through holes 51 which approximately have the shape of a keyhole. A plugging section 52 has an approximately circular cross-section to be able to insert the contact element 40 through it. A securing section 53 with a reduced diameter and profile is connected to the plugging section 52. In the securing section 53, the contact element 40 is held in the securing position L in a positive fit manner. The contact openings 58 or through holes 51 are here only open along and against the plugging direction S.

Figure 9:
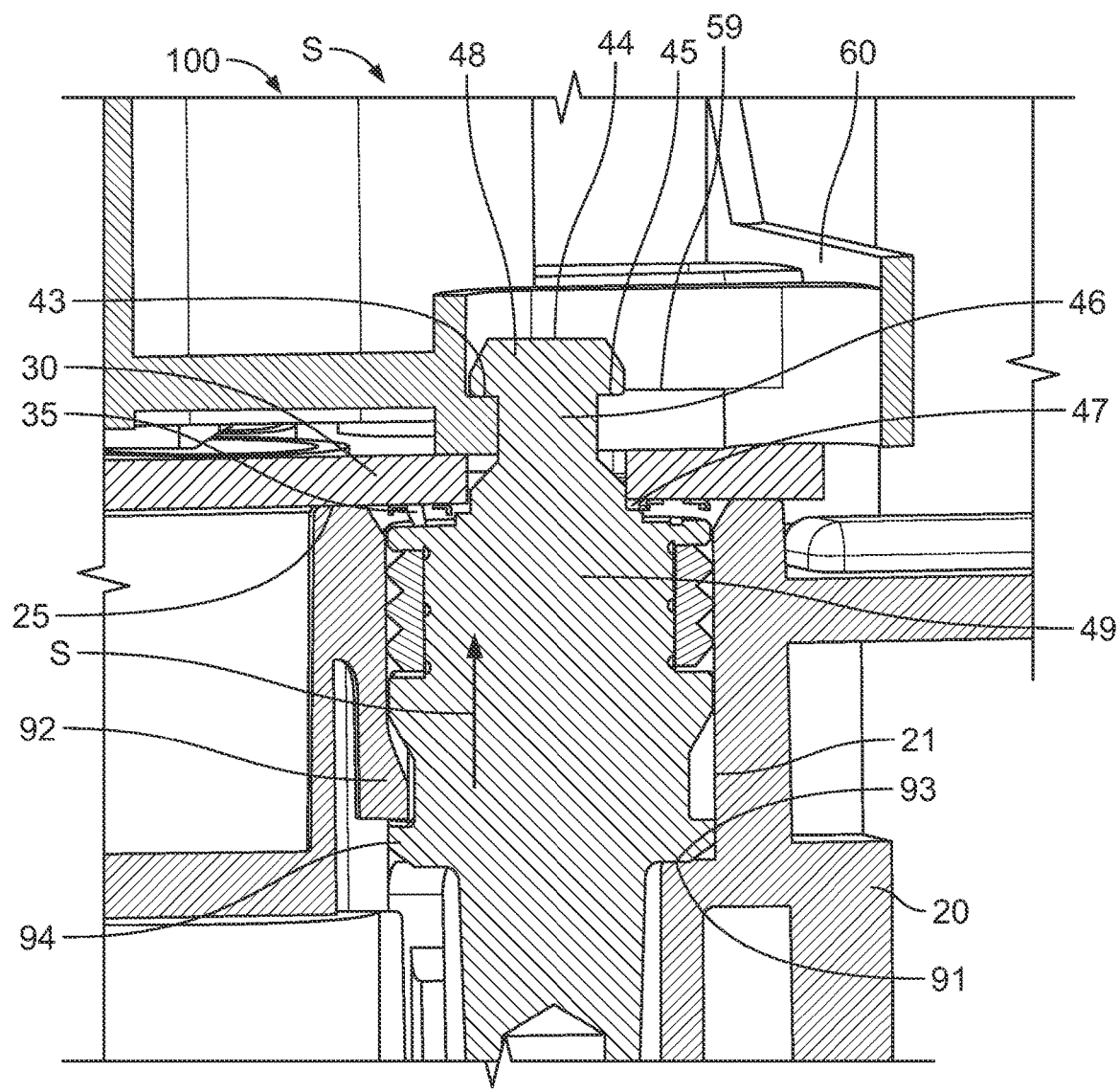
FIG. 9 is a detailed partial sectional perspective view of the embodiment of FIG. 1 in a securing position.

In FIG. 9, the holding mechanism is represented in a sectional view. The contact element 40 is inserted in an opening 21 in the plug body 20. A stop face 93 at the contact element 40 which abuts against a mating stop face 91 at the plug body 20 here prevents a further movement of the contact element 40 against the plugging direction S. A movement of the contact element 40 along the plugging direction S is prevented by a locking element 94 at the contact element 40 which is locked with a mating locking element 92 at the plug body 20. Consequently, the contact element 40 is secured in the plug body 20 along and against the plugging direction S in a positive fit manner.

The retention of the printed circuit board 30 along the plugging direction S is effected by a holding face 45 of the contact element 40 abutting against a securing face 59 of the securing member 50. The securing face 59 is part of the securing section 53. Both the holding face 45 and the securing face 59 each extend perpendicular to the plugging direction S and face into opposite directions.

The holding face 45 is arranged at an undercut 43 of the contact element 40. A neck section 46 of the contact element 40 has a smaller diameter compared to a tip 48 and a shank 49. The contact element 40 has a mushroom-shaped end 44.

The printed circuit board 30 is secured against the plugging direction S in a positive fit manner by on the one hand abutting against the plug body 20 at a supporting face 25. On the other hand, a mating holding face 47 at the contact element 40 prevents a movement of the printed circuit board 30 against the plugging direction S relative to the contact element 40. The mating holding face 47 extends perpendicular to the plugging direction S and is oriented opposite to the holding face 45.

Due to the positive connections between the plug body 20, the contact element 40, the printed circuit board 30, and the securing member 50, these elements are held against each other directly and indirectly in a positive fit manner along and against the plugging direction S.

In FIG. 8, a locking mechanism 81 can furthermore be seen which locks and secures the securing element 60 in the securing position L. The locking mechanism 81 has a locking projection 82 at the plug body 20 and a locking projection 86 at the securing element 60. During the transfer of the securing element 60 to the securing position L, the locking projection 86 is initially deflected relative to the locking projection 82 due to a spring section 83 and two ramp sections. When the securing position L is reached, the locking projection 86 then automatically protrudes, and two stop faces at the locking projections 82, 86 abut against each other and block a movement out of the securing position L. To unlock the locking mechanism 81 again, the locking projection can be deflected e. g. manually.

In FIGS. 10 to 17, a further embodiment of an assembly 100 is shown.

Figure 10:
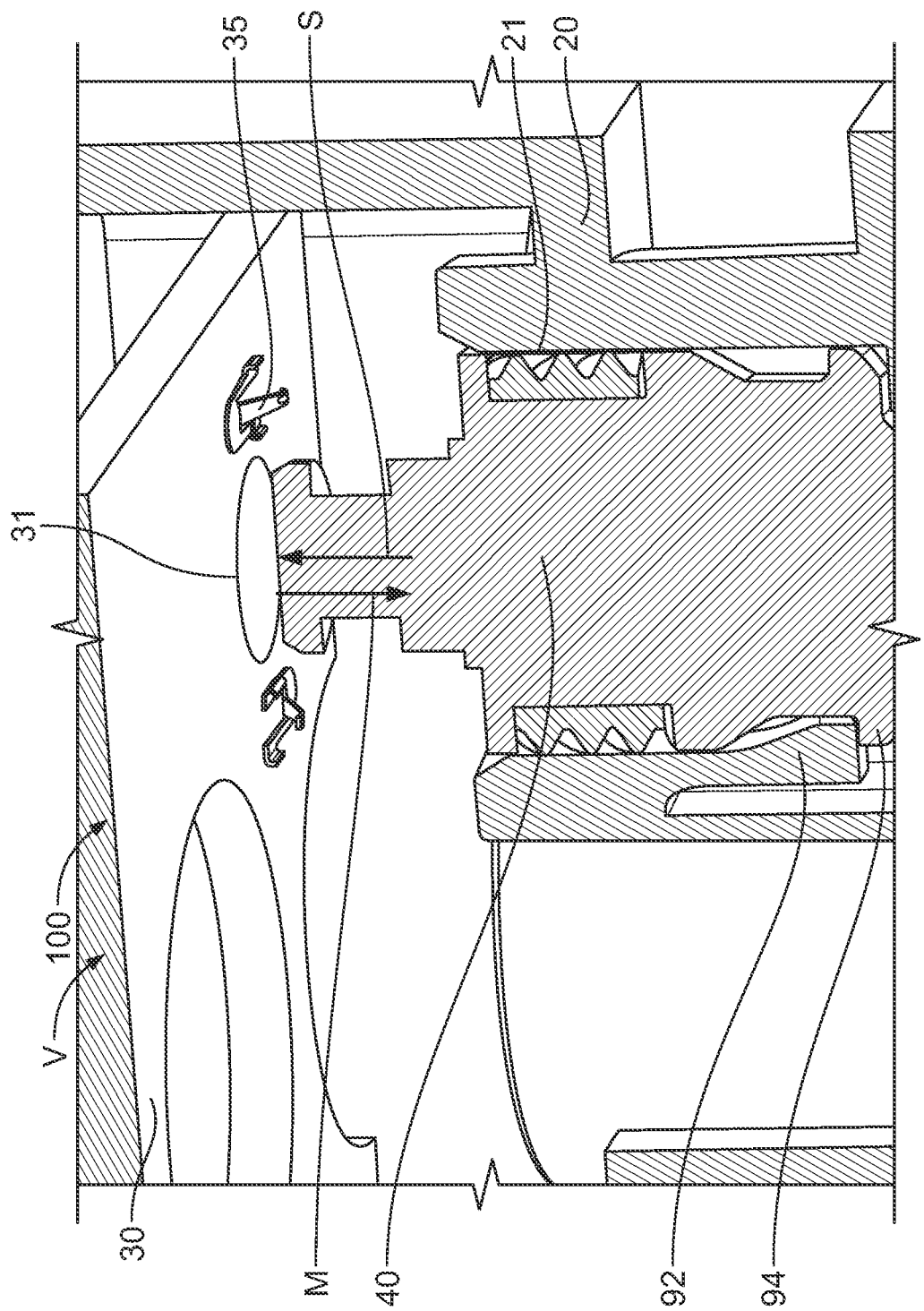
FIG. 10 is a partial sectional perspective view of a further embodiment of an assembly in a pre-assembly position.
Figure 11:
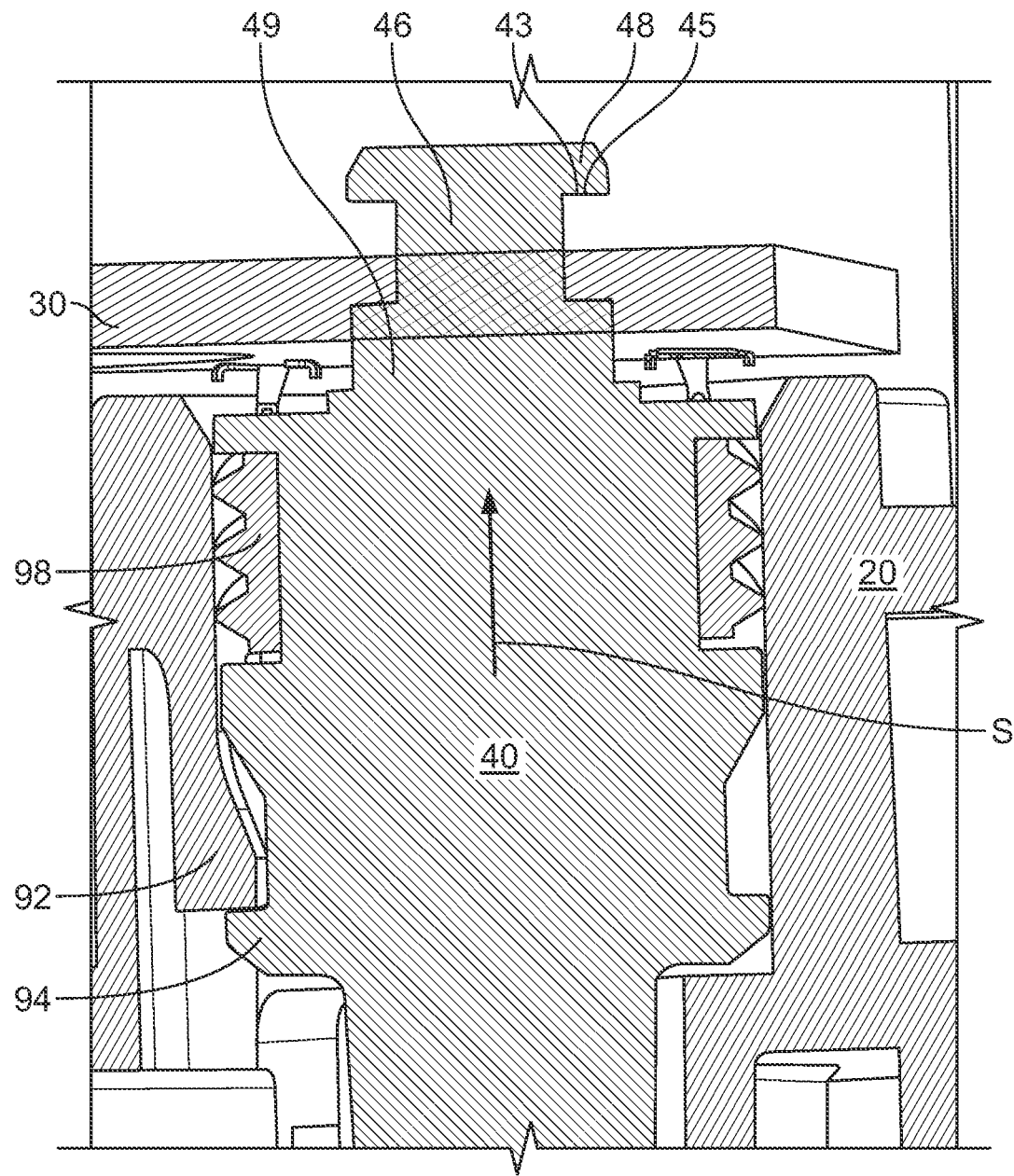
FIG. 11 is a detailed partial sectional perspective view of the embodiment of FIG. 10 in the pre-assembly position.

In the pre-assembly position V according to FIGS. 10 and 11, the contact element 40 is inserted through the printed circuit board 30 along the plugging direction S. This is accomplished in turn by the printed circuit board 30 being guided along the assembly direction M, which extends opposite to the plugging direction S, via the contact element 40 and around the contact element 40. In the process, an upper part of the contact element 40 is inserted through an opening 31 with the holding face 45. Previously, the contact element 40 had been inserted again into the plug body 20 and there secured along and against the plugging direction S.

Furthermore, a sealing element 98 is provided at the contact element 40 which achieves a sealing between the contact element 40 and the plug body 20.

Figure 12:
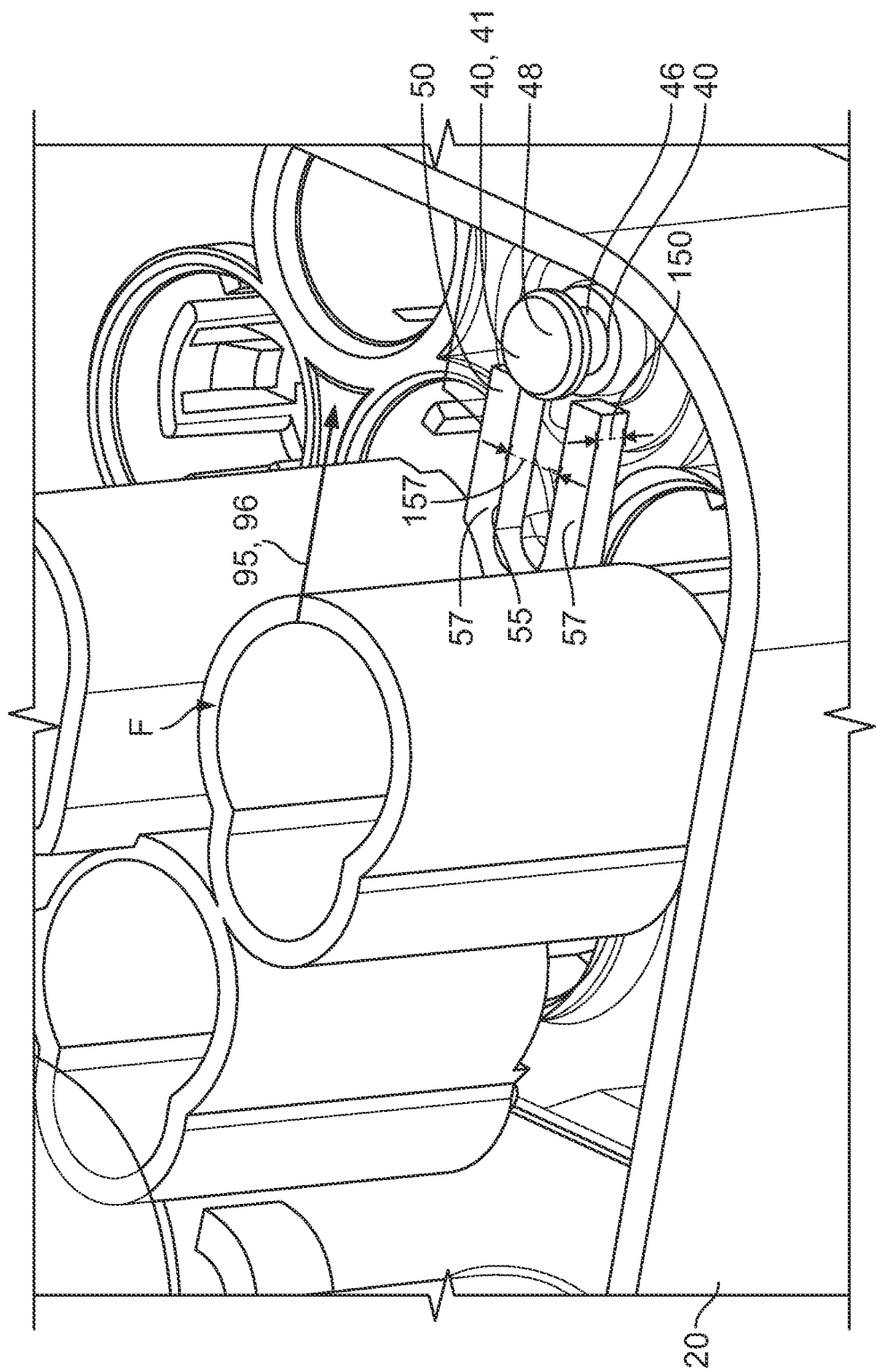
FIG. 12 is a perspective view of the embodiment of FIG. 10 in a release position.

Subsequently, the securing element 60 is attached, see FIG. 12. In the process, the securing member 50 is still located next to the corresponding contact element 40. The assembly 100 is in a release position F in which the contact element 40 is not yet secured or fixed along the plugging direction S by the securing member 50.

By a movement of the securing element 60 and the securing member 50, which is a section or part of the securing element 60, a transfer to the pre-securing position P is accomplished in which at least a first contact element 40, 41 is already secured along the plugging direction S in a positive fit manner. The securing member 50 is in this case embodied in a fork shape or with an open oblong hole 54. The oblong hole 54 is open perpendicular to the plugging direction S so that a simple reception of the neck section 46 of the contact element 40 is possible by the movement perpendicular to the plugging direction S. Since the printed circuit board 30 already extends below the securing element 60 in the release position F, the two can be prevented from getting caught during further movements.

The securing member 50 includes two prongs 57 which extend in parallel with respect to each other. A distance 157 between the two prongs 57 is here constant along the path section 95. Thereby, the path section 95 is simultaneously a guiding path 96 of a guiding member 55 formed by the securing member 60. In another embodiment, the distance 157 could also decrease towards the securing position L, for example, to facilitate the joining of the contact element 40 at the beginning, however, to simultaneously ensure a lateral positioning in the securing position L.

A thickness 150 of the prongs 57 and thereby of the securing member 50 is also constant. In other embodiments, this thickness 150 could increase towards the securing position L to achieve a clamping effect. In the shown example, however, a contact force at the printed circuit board 30 is already produced by the mating contact elements 35 embodied as springs.

In contrast to the embodiment according to FIGS. 1 to 9, where the securing members 50 comprise openings in a plate, in this embodiment, the securing member 50 protrudes from the rest of the securing element 60. Furthermore, here, the securing member 50 is open laterally, i. e. perpendicular to the plugging direction S.

Figure 13:
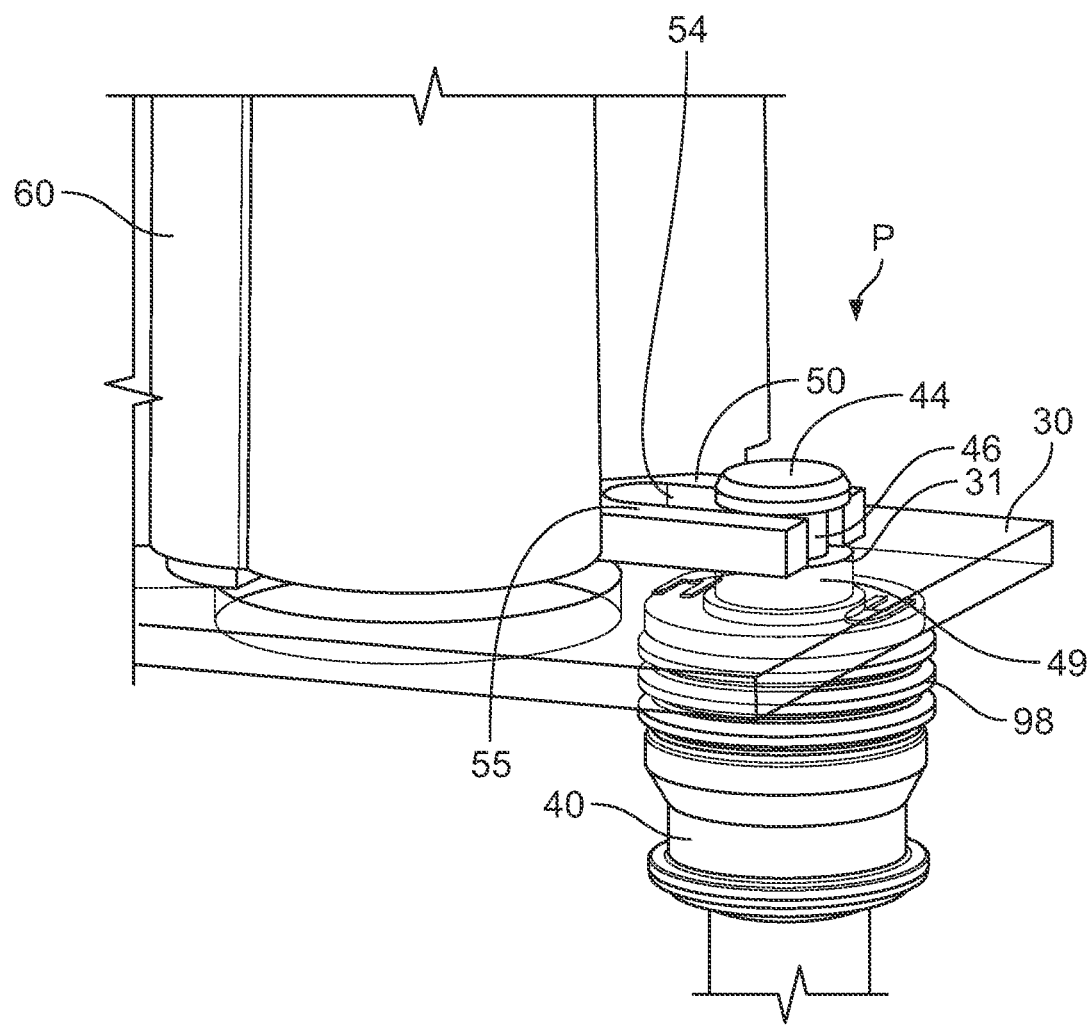
FIG. 13 is a perspective view of parts of the embodiment of FIG. 10 in a pre-securing position.

As can be seen e. g. in FIG. 13, the neck section 46 of the contact element 40 can center the contact element 40 in the opening 31 of the board or printed circuit board 30 and thus position the mating contact element 35 to the horizontal contact face of the contact element 40.

Figure 14:
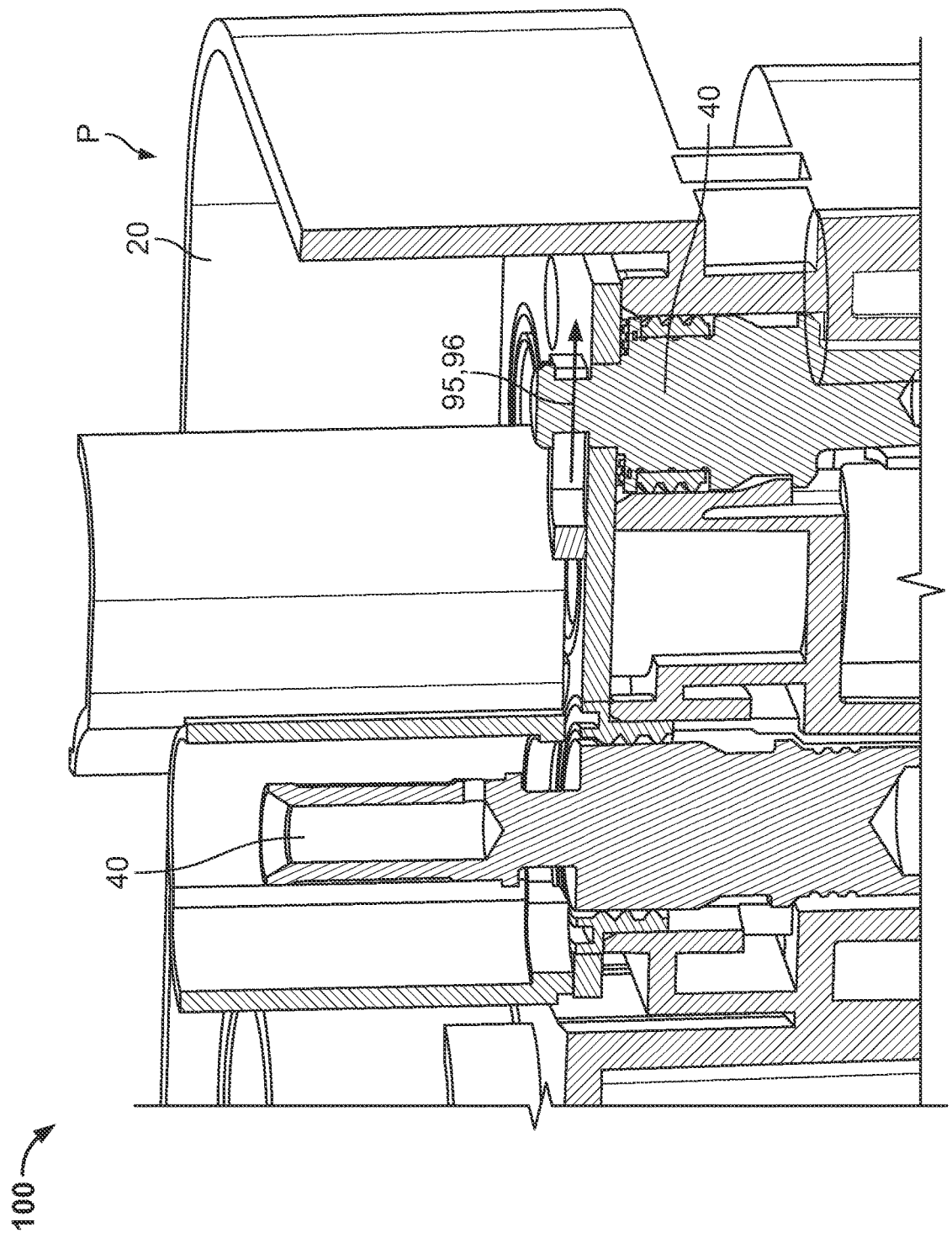
FIG. 14 is a partial sectional perspective view of the embodiment of FIG. 10 in the pre-securing position.
Figure 15:
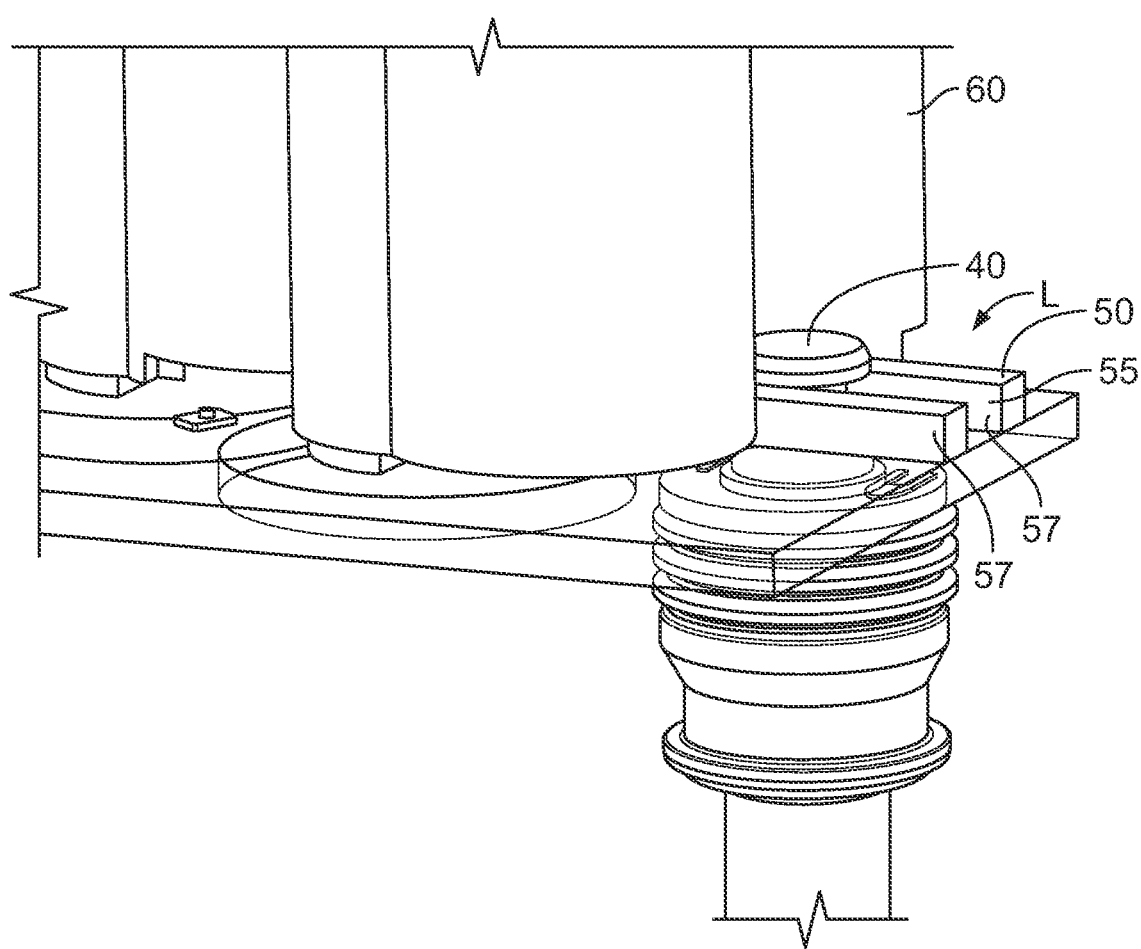
FIG. 15 is a perspective view of parts of the embodiment of FIG. 10 in a securing position.
Figure 16:
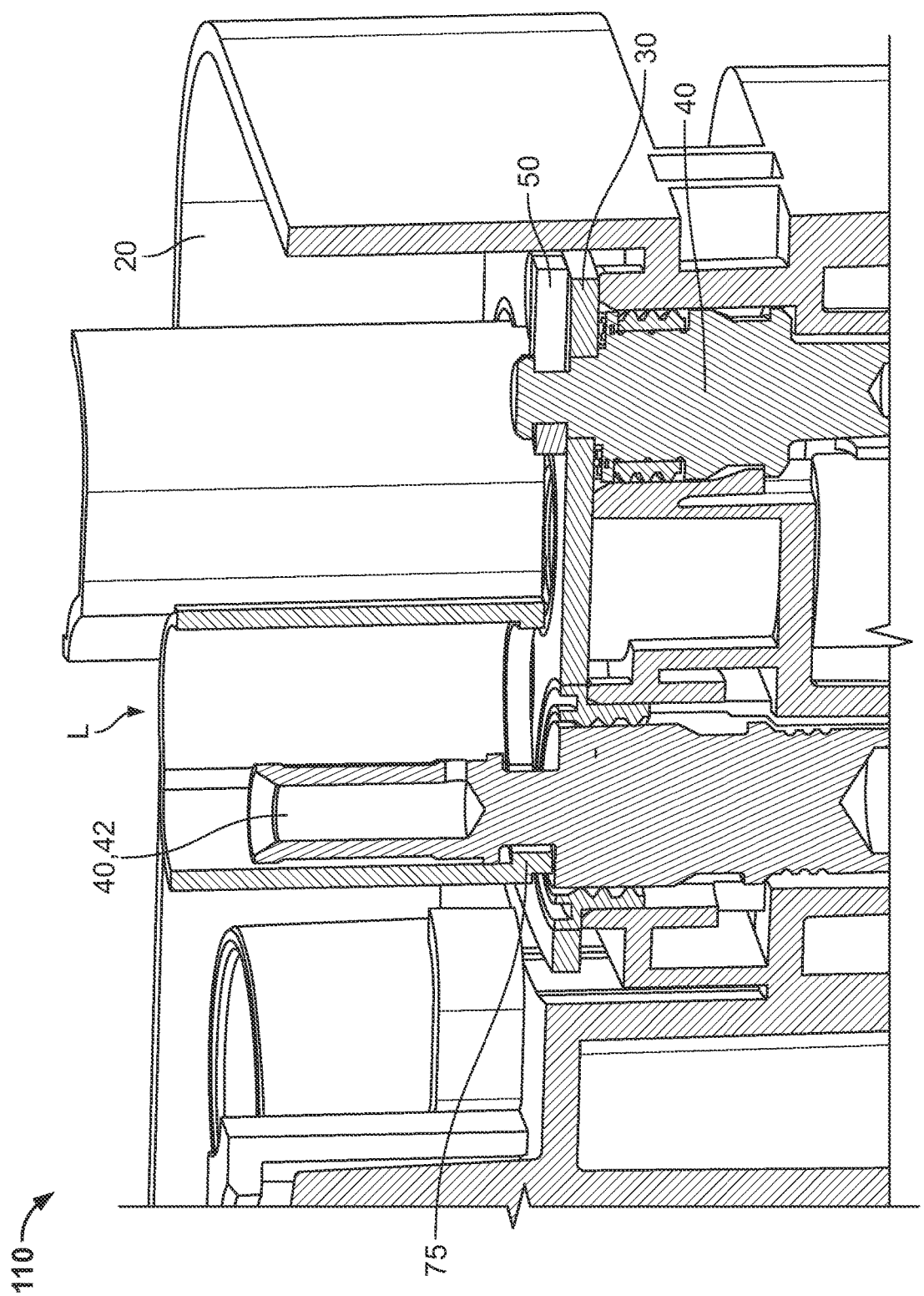
FIG. 16 is a partial sectional perspective view of the embodiment of FIG. 10 in the securing position.

As can be seen, for example, in FIG. 14, in the pre-securing position P, at least one further contact element 40 can be inserted. Since in the pre-securing position P, no positive fit retention of this second contact element 40, 42 is yet accomplished, it can be inserted along or against the plugging direction S.

By a further movement along the path section 95, the securing element 60 is now transferred to the securing position L. In this securing position L, all contact elements 40, 41, 42 are secured directly or indirectly along and against the plugging direction S.

Figure 17:
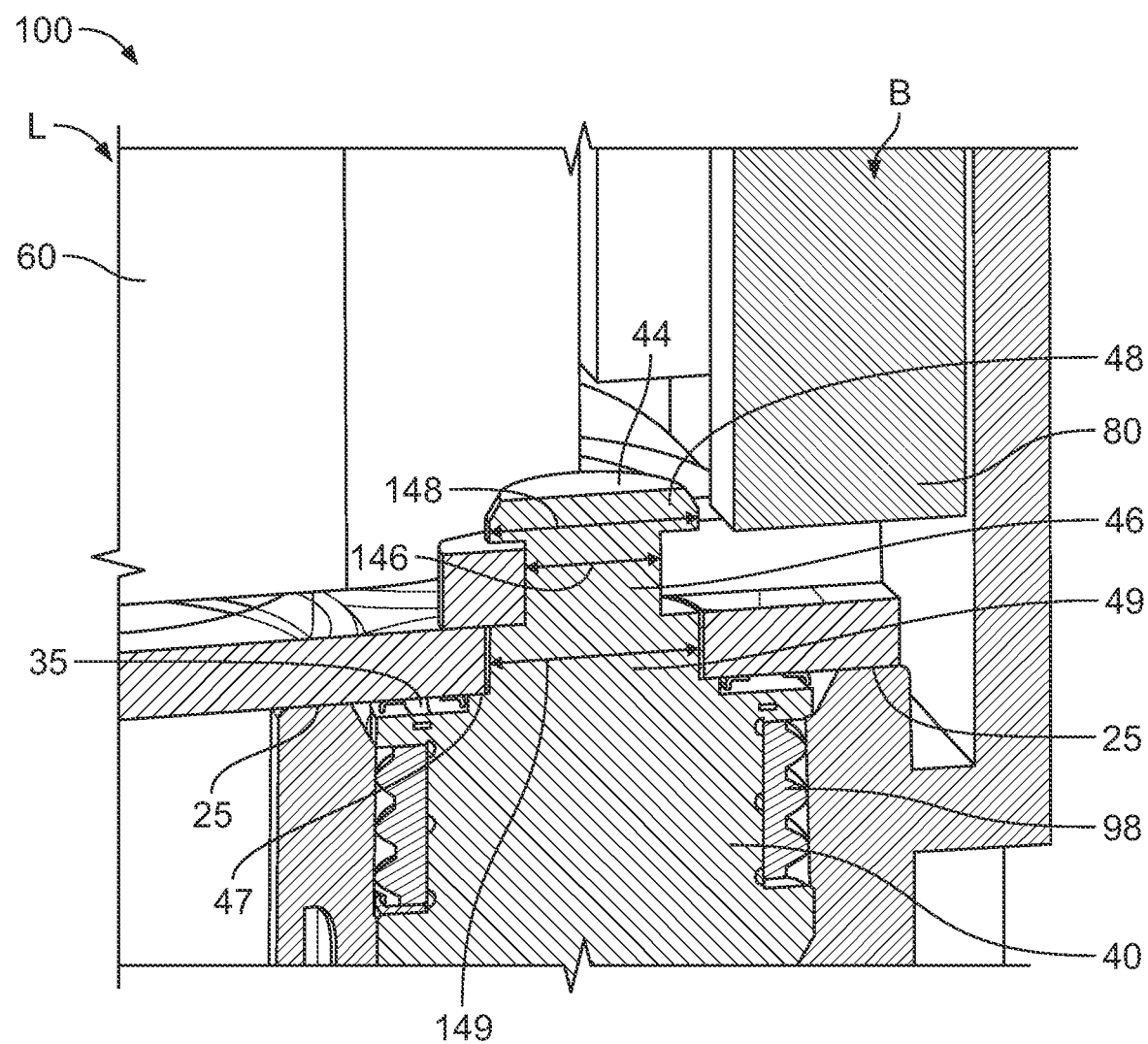
FIG. 17 is a detailed sectional perspective view of the embodiment of FIG. 10 in a securing position.

In FIG. 17, a blocking element 80 is shown in a blocking position B in which a movement of the securing member 50 is blocked in the plugging direction S. This can increase mechanical stability.

Furthermore, FIG. 17 shows that a diameter 146 of the neck section 46 of the contact element 40 is smaller than a diameter 148 of a tip 48 and a diameter 149 of the shank 49. The holding face 45 is arranged again at an undercut 43 of the contact element 40.

What is claimed is:

1. An Assembly for securing a printed circuit board to a plug body, comprising a contact element with a holding face facing against a plugging direction of the contact element, and a securing member that can be transferred to a securing position in which the printed circuit board is secured to the holding face along the plugging direction by the securing member positioned between the printed circuit board and the holding face in a positive fit manner, the printed circuit board abuts against a mating holding face at the contact element oriented opposite to the holding face in the securing position against the plugging direction in a positive fit manner.

2. The assembly according to claim 1, wherein the holding face is arranged at an under-cut of the contact element.

3. The assembly according to claim 1, wherein the contact element includes a neck section located between a tip and a shank.

4. The assembly according to claim 1, wherein the securing member is open perpendicular to the plugging direction.

5. The assembly according to claim 1, wherein the securing member includes a through hole extending along the plugging direction.

6. The assembly according to claim 1, wherein the securing member is part of a securing element which includes at least one further securing member, wherein in the securing position, the further securing member secures at least one further contact element in its position against the plugging direction in a positive fit manner.

7. The assembly according to claim 1, wherein in the securing position, the contact element is pressed against a mating contact element at the printed circuit board.

8. The assembly according to claim 1, wherein in the securing position, the printed circuit board is clamped by the securing member.

9. The assembly according to claim 1, wherein a path section, along which the securing member is brought to the securing position, extends perpendicular to the plugging direction.

10. The assembly according to claim 1, wherein the securing member includes a guiding member which guides the securing member to the securing position.

11. The assembly according to claim 1, wherein a securing element includes a plurality of securing members each with at least one guiding member, wherein the guiding members define one single guiding path for the securing element.

12. The assembly according to claim 1, wherein in a pre-securing position, in which the printed circuit board is held by the securing member along the plugging direction in a positive fit manner, at least one further contact element is not secured by the corresponding securing member.

13. The assembly according to claim 1, wherein the contact element is formed of a conductive material.

14. A method of securing a printed circuit board to a plug body, wherein a holding face of a contact element oriented against a plugging direction is inserted through an opening in the printed circuit board, and subsequently, a securing member is transferred to a securing position in which the printed circuit board is held at the holding face along the plugging direction by the securing member positioned between the printed circuit board and the holding face in a positive fit manner, the printed circuit board abuts against a mating holding face at the contact element oriented opposite to the holding face in the securing position against the plugging direction in a positive fit manner.

15. An Assembly for securing a printed circuit board to a plug body, comprising a contact element with a holding face facing against a plugging direction of the contact element, and a securing member that can be transferred to a securing position in which the printed circuit board is secured to the holding face along the plugging direction by the securing member positioned between the printed circuit board and the holding face in a positive fit manner, and in a pre-securing position in which the printed circuit board is held by the securing member along the plugging direction in a positive fit manner, at least one further contact element is not secured by the corresponding securing member.

* * * * *